United States Patent
Toyama et al.

(10) Patent No.: US 10,727,819 B2
(45) Date of Patent: Jul. 28, 2020

(54) INFORMATION PROCESSING DEVICE, SEMICONDUCTOR DEVICE, AND INFORMATION PROCESSING METHOD

(71) Applicant: KABUSHIKI KAISHA TOSHIBA, Minato-ku (JP)

(72) Inventors: Yosuke Toyama, Kawasaki (JP); Kentaro Yoshioka, Kawasaki (JP); Kohei Onizuka, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 32 days.

(21) Appl. No.: 16/126,031

(22) Filed: Sep. 10, 2018

(65) Prior Publication Data

US 2019/0273483 A1 Sep. 5, 2019

(30) Foreign Application Priority Data

Mar. 5, 2018 (JP) .................. 2018-039013

(51) Int. Cl.
*H03K 3/03* (2006.01)
*H03K 5/13* (2014.01)
*H03K 5/00* (2006.01)

(52) U.S. Cl.
CPC ............. *H03K 3/0315* (2013.01); *H03K 5/13* (2013.01); *H03K 2005/0015* (2013.01); *H03K 2005/00058* (2013.01)

(58) Field of Classification Search
CPC ... G06F 7/50; G06F 7/52; G06F 7/523; G06F 7/544; G06F 7/5443; G06F 7/60;
(Continued)

(56) References Cited

U.S. PATENT DOCUMENTS 9,361,577 B2 6/2016 Miyashita
2011/0090015 A1* 4/2011 Sumita .................. H03K 3/0315
331/56
(Continued)

FOREIGN PATENT DOCUMENTS

JP 5885719 3/2016
JP 2018-197930 A 12/2018

OTHER PUBLICATIONS

Y. Toyama, An 8 Bit 12.4 TOPS/W Phase-Domain MAC Circuit for Energy-Constrained Deep Learning Accelerators, IEEE Journal of Solid-State Circuits, vol. 54, No. 10, Oct. 2019 (Year: 2019).*
(Continued)

*Primary Examiner* — Andrew Caldwell
*Assistant Examiner* — Emily E Larocque
(74) *Attorney, Agent, or Firm* — Oblon, McClelland, Maier & Neustadt, L.L.P.

(57) ABSTRACT

According to one embodiment, an information processing device, includes: a digital-to-pulse converter configured to output a pulse signal including a pulse with a pulse length corresponding to a digital input signal; and a bidirectional selective oscillator including a first ring oscillator and a second ring oscillator, the first ring oscillator including a plurality of delay elements connected in a ring shape in a first direction, the second ring oscillator including a plurality of delay elements connected in a ring shape in a second direction reverse to the first direction. The bidirectional selective oscillator is configured to select one of the first ring oscillator and the second ring oscillator depending on a sign of the digital input signal, oscillate the selected ring oscillator during a period when the pulse is outputted, and keep a state of oscillation operation when the pulse stops being outputted.

15 Claims, 14 Drawing Sheets

(58) Field of Classification Search
CPC .... G06F 7/62; G06F 7/64; G06F 7/66; H03K 5/13; H03K 5/131; H03K 5/14; H03K 5/06; H03K 3/0315; G06N 20/00; G06N 3/04; G06N 3/06; G06N 3/063
See application file for complete search history.

(56) References Cited

U.S. PATENT DOCUMENTS

| | | | |
|---|---|---|---|
| 2013/0002329 A1* | 1/2013 | Murofushi | G01S 7/032 |
| | | | 327/231 |
| 2014/0091866 A1* | 4/2014 | Schimper | H03K 3/0315 |
| | | | 331/57 |
| 2018/0175838 A1* | 6/2018 | Hashimoto | H03K 5/135 |
| 2018/0211165 A1* | 7/2018 | Oh | G06N 3/08 |
| 2018/0343004 A1 | 11/2018 | Yoshioka et al. | |

OTHER PUBLICATIONS

Miyashita, D. et al. "An LDPC Decoder With Time-Domain Analog and Digital Mixed-Signal Processing," IEEE Journal of Solid State Circuits, vol. 49, No. 1, 2014, pp. 11.

Straayer, M. et al., "A multi-path gated ring oscillator TDC with first-order noise shaping," IEEE Journal of Solid State Circuits, vol. 44, No. 4, 2009, pp. 10.

* cited by examiner

INFORMATION PROCESSING DEVICE, SEMICONDUCTOR DEVICE, AND INFORMATION PROCESSING METHOD

CROSS REFERENCE TO RELATED APPLICATIONS

This application is based upon and claims the benefit of priority from the prior Japanese Patent Application No. 2018-039013, filed on Mar. 5, 2018, the entire contents of which are incorporated herein by reference.

FIELD

Embodiments of the present invention relate to an information processing device, a semiconductor device, and an information processing method.

BACKGROUND

Recently, artificial intelligence (AI) receives attention. AI requires learning using a large amount of data and performing arithmetic processing using results of the learning, which causes an enormous amount of arithmetic processing. Accordingly, use of hardware to implement at least part of AI processing has been studied. In the arithmetic processing of AI, operations including integration, multiply-accumulate, and the like are performed many times. Therefore, hardware that performs operations at high speed and with low power consumption is required.

SUMMARY

According to one embodiment, an information processing device, includes: a digital-to-pulse converter configured to output a pulse signal including a pulse with a pulse length corresponding to a digital input signal; and a bidirectional selective oscillator including a first ring oscillator and a second ring oscillator, the first ring oscillator including a plurality of delay elements connected in a ring shape in a first direction, the second ring oscillator including a plurality of delay elements connected in a ring shape in a second direction reverse to the first direction. The bidirectional selective oscillator is configured to select one of the first ring oscillator and the second ring oscillator depending on a sign of the digital input signal oscillate the selected ring oscillator during a period when the pulse is outputted, and keep a state of oscillation operation when the pulse stops being outputted.

DETAILED DESCRIPTION

Hereinafter, embodiments of the present invention will be described with reference to drawings.

First Embodiment

Figure 1:
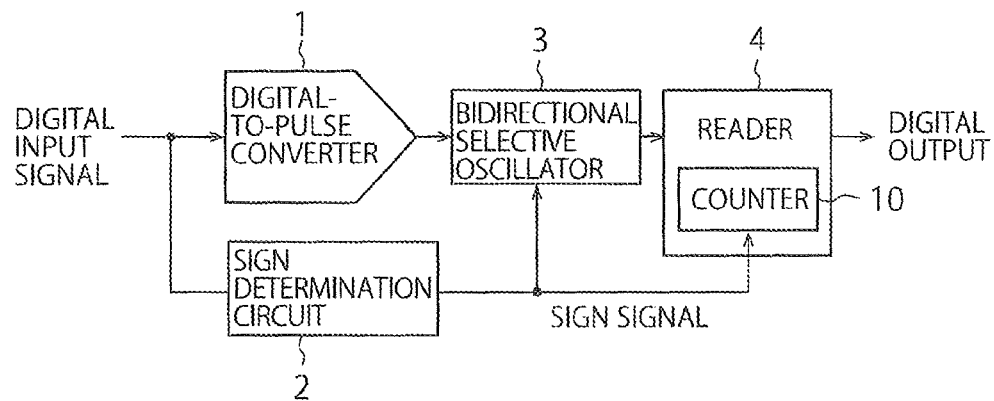
FIG. 1 is a block diagram showing a schematic configuration of an information processing device according to a first embodiment.

FIG. 1 is a block diagram showing a schematic configuration of an information processing device according to a first embodiment. The information processing device shown in FIG. 1 is an operation circuit that computes a result of integration of N digital input signals ("N" is an integer not smaller than 2). If the digital input signals inputted to the information processing device of FIG. 1 is represented by "DIN[1:N]", a digital output signal "Out", which is an output of the information processing device, is expressed by the following expression (1),

[Expression 1]

$$\mathrm{Out} = \sum_{i=1}^{N} DIN[i] \quad (1)$$

The information processing device of FIG. 1 includes a digital-to-pulse converter 1, a sign determination circuit 2, a bidirectional selective oscillator 3, and a reader 4.

The digital-to-pulse converter 1 outputs a pulse signal including a pulse with a pulse length corresponding to a digital input signal. For example, the digital-to-pulse converter 1 outputs a pulse signal including a pulse with a pulse length of 1 ns when the digital input signal is 1, and outputs a pulse signal including a pulse with a pulse length of 4 ns when the digital input signal is 4.

Figure 2:
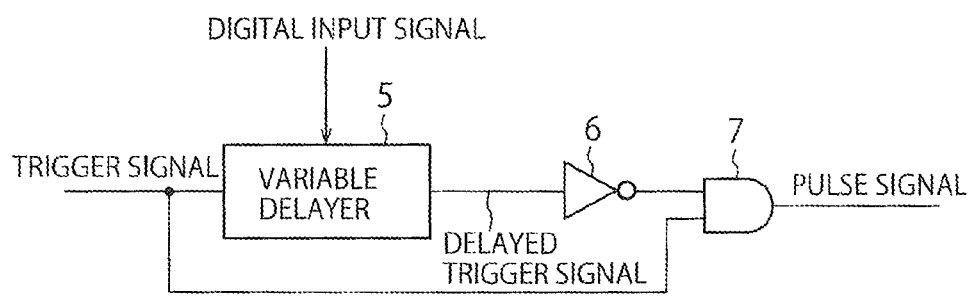
FIG. 2 is a block diagram showing an example of an internal configuration of a digital-to-pulse converter.
Figure 3:
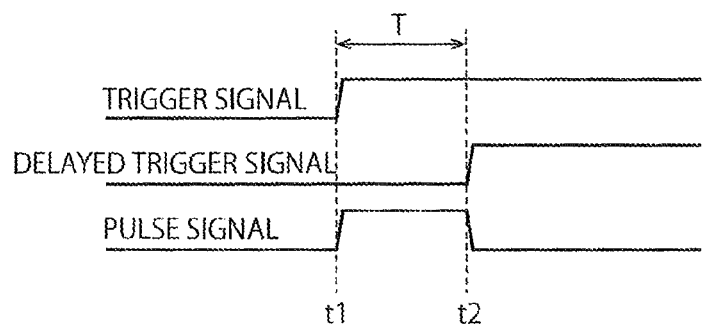
FIG. 3 is an operational timing chart of the digital-to-pulse converter of FIG. 2.

FIG. 2 is a block diagram showing an example of an internal configuration of the digital-to-pulse converter 1, and FIG. 3 is an operational timing chart of the digital-to-pulse converter 1 of FIG. 2. The digital-to-pulse converter 1 of FIG. 2 includes a variable delayer 5, an inverter 6, and an AND circuit 7. A trigger signal and a digital input signal are inputted to the variable delayer 5. The trigger signal is a signal that changes from low level to high level in line with a timing at which the digital-to-pulse converter 1 starts operating. The variable delayer 5 outputs a delayed trigger signal, which is obtained by delaying the trigger signal by a delay amount corresponding to the digital input signal. The inverter 6 inverts the delayed trigger signal and outputs an inverted signal. The AND circuit 7 outputs a logical product signal of the signal outputted from the inverter 6 and the trigger signal. The signal outputted from the AND circuit 7 is a pulse signal including a pulse with a pulse length corresponding to the digital input signal. In the pulse signal, the pulse portion is a high level and the other portion is a low level.

Referring to FIG. 3, when the trigger signal changes from low level to high level at time t1, the variable delayer 5 delays the trigger signal by a time period T corresponding to the digital input signal and outputs the delayed trigger signal that changes from low level to high level at time t2. The AND circuit 7 outputs the pulse signal that is a logical product of the trigger signal and an inverted signal of the delayed trigger signal. The pulse length of the pulse included in the pulse signal is nearly equal to the time period T by which the variable delayer 5 delays the trigger signal.

The sign determination circuit 2 determines a sign of the digital input signal and outputs a sign signal, which indicates a determination result, to the bidirectional selective oscillator 3 and the reader 4. When the determination result is "positive", the sign signal is at high level. When the determination result is "negative", the sign signal is at low level. However, relations between the sign and the signal level may be inverted.

The bidirectional selective oscillator 3 performs oscillation operation while a pulse of the pulse signal is inputted, and keeps a state of the oscillation operation when the input of the pulse stops. In other words, the bidirectional selective oscillator 3 performs oscillation operation only while an enable signal is at high level, and stops oscillation while the enable signal is at low level, keeping a state of the oscillation operation in which the bidirectional selective oscillator 3 is when the enable signal changes from high level to low level. A direction of the oscillation operation (a direction in which a phase is shifted) is determined depending on the sign signal inputted from the sign determination circuit 2. A phase is shifted in forward direction when the sign signal is at high level, and in reverse direction when the sign signal is at low level. While the enable signal is at low level, oscillation is stopped and an oscillation phase state is kept. Here, a state of the oscillation operation includes, for example, the number of oscillations and a phase state of an oscillation signal. The number of oscillations increases by one when the phase has made one cycle (2π shift) in forward direction. A resulting value of an operation (integration of a digital input signal value) can be identified based on a combination of the number of oscillations and the phase state.

The reader 4 outputs the digital output signal including a state of the oscillation operation. That is, the reader 4 outputs the digital output signal including information on the number of oscillations and the phase state of the oscillation signal in the bidirectional selective oscillator 3. Here, although a state of the oscillation operation is included in the digital output signal, a state of the oscillation operation may be converted to a resulting value of an operation (an integrated value) and the integrated value may be included in the digital output signal. In other words, the digital output signal may include information indicating a state of the oscillation operation itself, or may include an integrated value obtained by converting a state of the oscillation operation.

Figure 4:
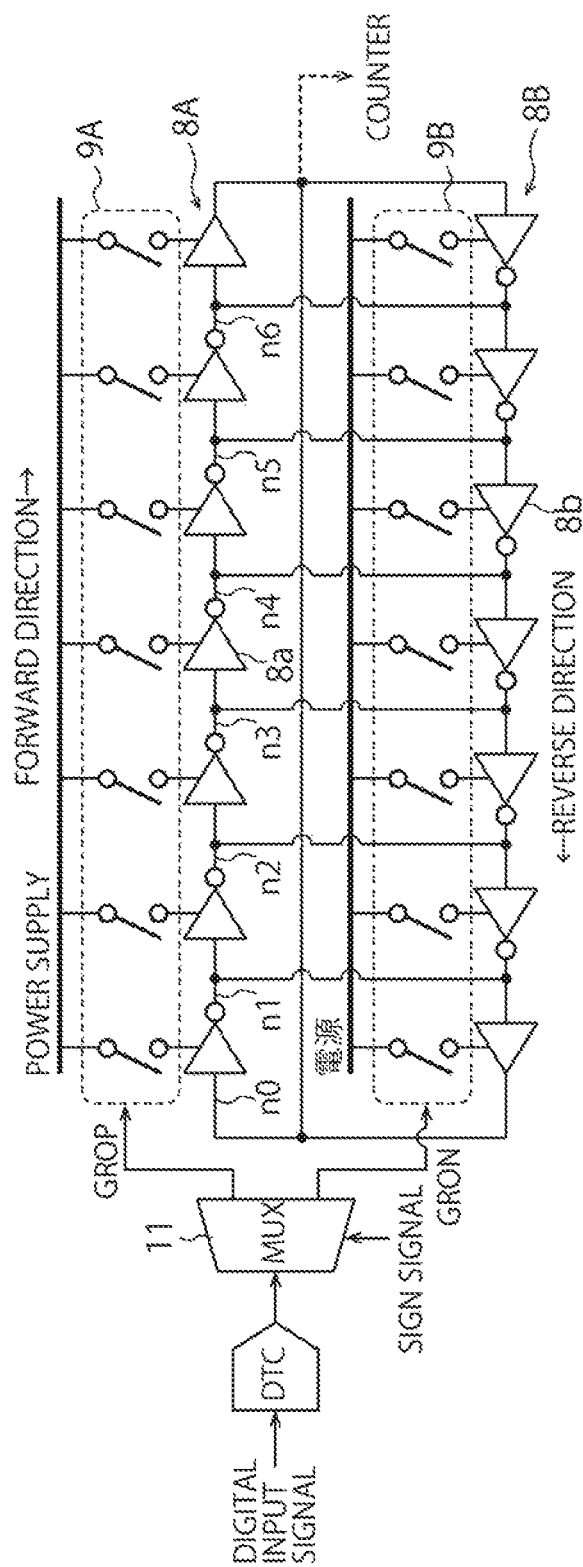
FIG. 4 is a diagram showing a specific example of a bidirectional selective oscillator.

FIG. 4 is a diagram showing a specific example of the bidirectional selective oscillator 3. The bidirectional selective oscillator 3 is an information processing device including a multiplexer 11, a forward ring oscillator 8A, a plurality of switches 9A, a reverse ring oscillator 8B, a plurality of switches 9B, and a counter 10. The forward ring oscillator 8A and the reverse ring oscillator 8B are collectively referred to as a bidirectional selective ring oscillator.

The multiplexer 11 receives, as inputs, the sign signal from the sign determination circuit 2 and the pulse signal from the digital-to-pulse converter 1. While the pulse signal inputted from the digital-to-pulse converter 1 is a pulse (at high level), the multiplexer 11 outputs a signal (GROP signal) to turn on all of the switches 9A when the sign signal is at high level, and outputs a signal (GRON signal) to turn on all of the switches 9B when the sign signal is at low level.

The forward ring oscillator 8A includes a plurality of delay elements 8a connected in a ring shape, which sequentially shift an initial pulse signal in forward direction (rightward along the plane of the page). The delay elements 8a in the forward ring oscillator 8A make an odd number of connected stages. In this example, the number of the connected stages is seven. Each delay element 8a is, for example, an inverter.

The plurality of switches 9A switch between enabling and disabling the plurality of delay elements 8a to perform delay operation. For example, each switch 9A switches between supplying and not supplying power supply voltage to a corresponding one of the delay elements 8a, Hereinafter, "ON" refers to a state where each switch 9A supplies power supply voltage to the corresponding delay element 8a, and "OFF" refers to a state where each switch 9A does not supply power supply voltage to the corresponding delay element 8a. Each delay element 8a delays an output signal of a prior-stage delay element 8a and outputs the signal when the corresponding switch 9A is ON, and stops operation of delaying signal shift when the corresponding switch 9A is OFF. All of the switches 9A synchronously fall in ON or OFF. That is, it does not happen that some of the switches 9A are ON and the other switches 9A are OFF. All of the switches 9A fall in ON, whereby the forward ring oscillator 8A oscillates, implementing operation of sequentially shifting the initial pulse signal by using the plurality of delay elements 8a.

The reverse ring oscillator 8B includes a plurality of delay elements 8b connected in a ring shape, which sequentially shift the initial pulse signal in reverse direction (leftward along the plane of the page). The delay elements 8b in the reverse ring oscillator 8B make an odd number of connected stages. In this example, the number of the connected stages is seven. Each delay element 8b is, for example, an inverter, A delay amount made by each delay element 8*b* is equal to a delay amount made by each delay element 8*a*.

The plurality of switches 9B switch between enabling and disabling the plurality of delay elements 8*b* to perform delay operation. For example, each switch 9B switches between supplying and not supplying power supply voltage to a corresponding one of the delay elements 8*b*. Each delay element 8*b* delays an output signal of a prior-stage delay element 8*b* and outputs the signal when the corresponding switch 9B is ON, and stops operation of delaying signal shift when the corresponding switch 9B is OFF. All of the switches 9B synchronously fall in ON or OFF, That is, it does not happen that some of the switches 9B are ON and the other switches 9B are OFF. All of the switches 9B fall in ON, whereby the reverse ring oscillator 8B oscillates, implementing operation of sequentially shifting the initial pulse signal by using the plurality of delay elements 8*b*.

Here, assuming that "X" is the number of the connected stages of the delay elements in each of the forward ring oscillator 8A and the reverse ring oscillator 8B, an input of a Y-th ("Y" is an integer not smaller than 1 and not larger than X) delay element in the forward ring oscillator 8A is connected to an output of an (X−Y+1)th delay element in the reverse ring oscillator 8B. Specifically, an input terminal of the first-stage delay element 8*a* in the forward ring oscillator 8A is connected to an output terminal of the seventh-stage delay element 8*b* in the reverse ring oscillator 8B. An input terminal of the second-stage delay element 8*a* in the forward ring oscillator 8A is connected to an output terminal of the sixth-stage delay element 8*b* in the reverse ring oscillator 8B. Similarly, input terminals of the third- to X-th-stage delay elements 8*a* in the forward ring oscillator 8A are connected to output terminals of the (X−3+1)th- to first-stage delay elements 8*b* in the reverse ring oscillator 8B, respectively. With such connections, the forward ring oscillator 8A and the reverse ring oscillator 8B can share a state of the oscillation operation.

A node n0 represents a node on the input side of the first-stage delay element 8*a* (a node on the output side of the seventh-stage delay element 8*b*), and nodes n1, n2, n3, n4, n5, and n6 represent nodes on the output sides of the first- to sixth-stage delay elements 8*a*, respectively.

Figure 5:
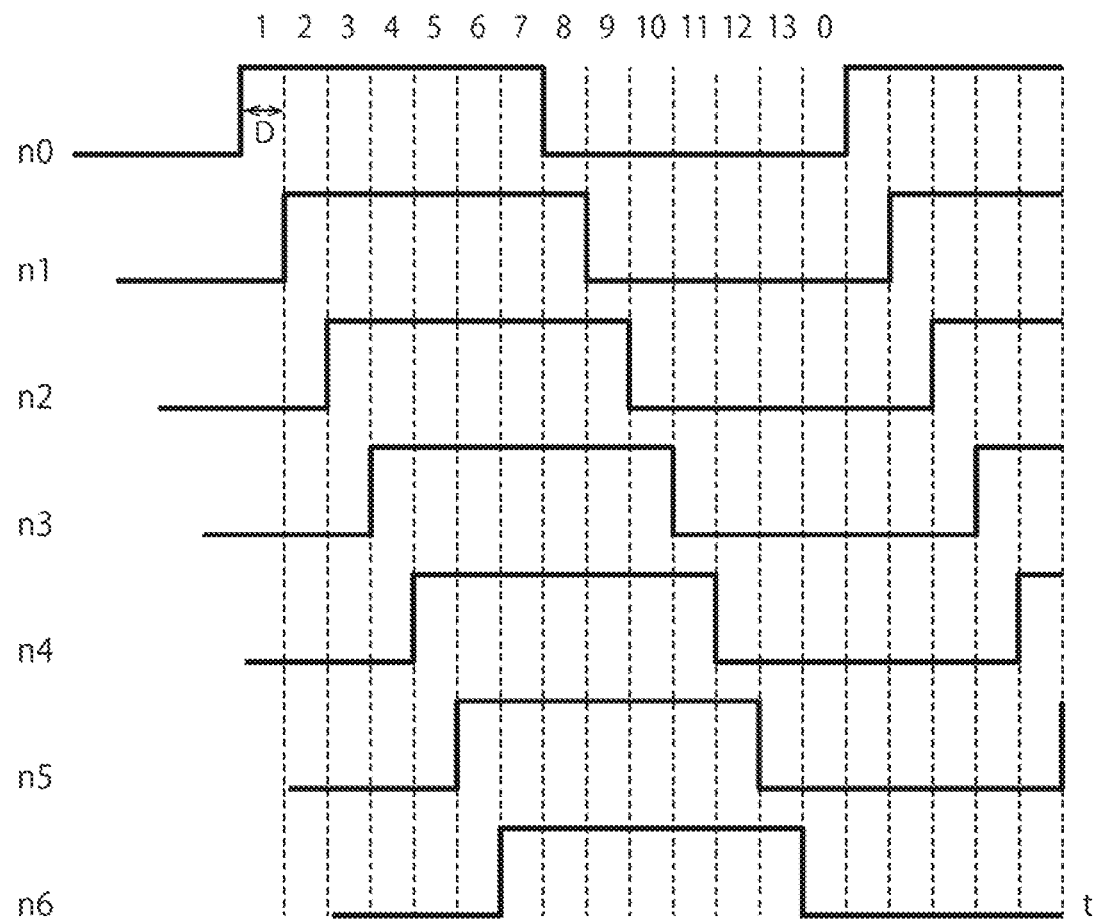
FIG. 5 is a diagram for explaining how the phase of an initial pulse signal is shifted by oscillation.

FIG. 5 shows an example in which the phase of an initial pulse signal with some pulse length is shifted by the forward ring oscillator 8A by a shift amount D (delay amount) corresponding to a delay time of each delay element in forward direction. Signal waveforms at the nodes n0 to n6 are shown. Viewed in order from the top along the plane of the page, the phase is shifted in forward direction. The direction is reversed when the phase is shifted by the reverse ring oscillator 8B. When the initial pulse signal makes one round of loop in the forward ring oscillator 8A, the phase is shifted by 2π. Values are assigned to combinations of high level and low level at these nodes, which will be described in detail later.

Figure 6:
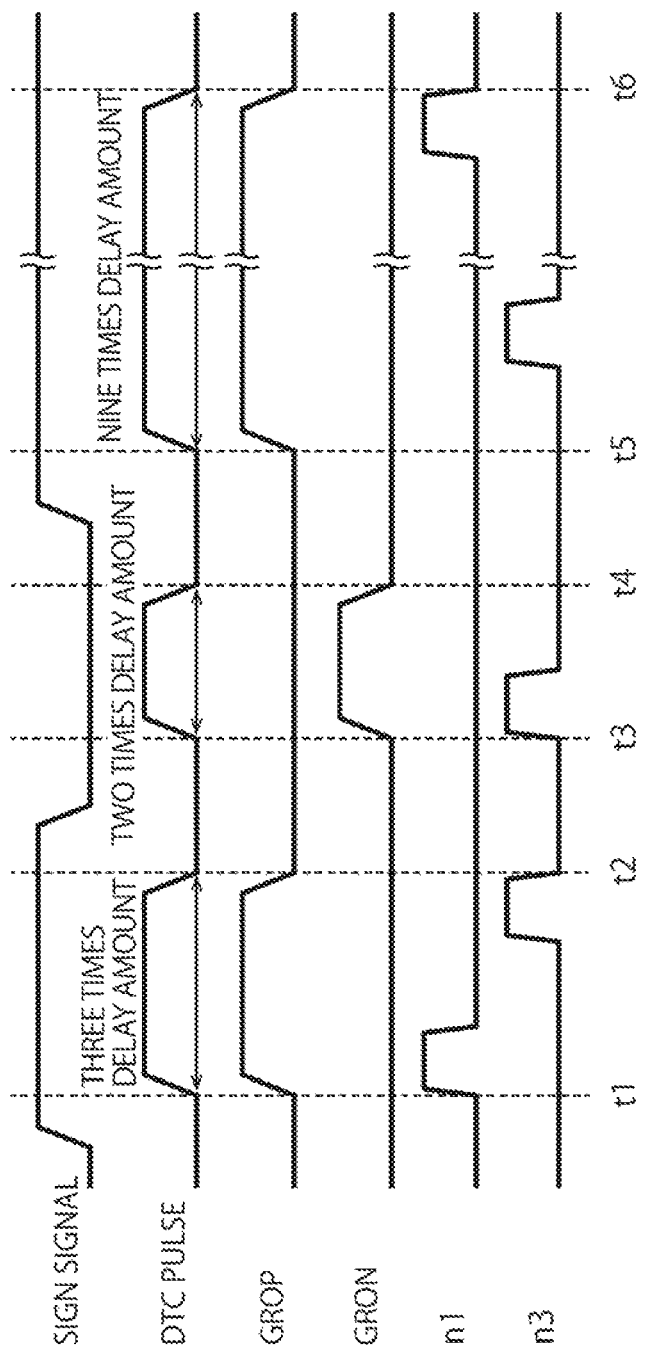
FIG. 6 is a timing chart in case of inputting three digital input signals to the bidirectional selective oscillator of FIG. 4.

FIG. 6 is a timing chart in case of inputting three digital input signals to the information processing device shown in FIG. 4. FIG. 6 shows an example in which 3, −2 and 9 as digital input signals are inputted in order. Here, a description will be given, assuming that the bidirectional selective oscillator 3 is initialized to a desired state, ignoring duty in an oscillation state, and replacing a phase state with a pulse for simplicity. The forward ring oscillator 8A and the reverse ring oscillator 8B are reset before the first digital input signal is inputted, and an initial pulse signal with a predetermined pulse length is inputted to the first-stage delay element 8*a*. The reset may be performed in an arbitrary manner. As an example, configuring the first-stage delay element 8*a* with NAND and the second- and subsequent-stage delay elements 8*a* with inverters, all of the switches 9A are ON in a state where one of two inputs of the NAND is at low level and the other input is connected to an output of the last-stage delay element 8*b*. Thus, the bidirectional selective oscillator 3 can be aligned to have a unique phase. When the reset is complete, the one of the inputs of the NAND is connected to the multiplexer 11.

When the digital input signal representing 3 is inputted, a sign signal becomes high level because 3 has a positive sign. On the other hand, the digital-to-pulse converter 1 outputs a pulse signal including a pulse with a pulse length corresponding to 3 (as long as three times the delay amount of each delay element 8*a*) at time t1. While the pulse with this pulse length is outputted, all of the switches 9A are ON and supply power supply voltage to all of the delay elements 8*a*. In an initial state, the initial pulse signal is inputted to the input terminal of the first-stage delay element 8*a*. The initial pulse signal (in the high-level state) first moves to the node n1 and shifts through delay elements one by one to a subsequent-stage delay element. Here, the initial pulse signal shifts through three delay elements, and reaches at the node n3 on the output side of the third-stage delay element 8*a* when the output pulse of the digital-to-pulse converter 1 drops at time t2. The GROP signal becomes low level to cause all of the switches 9A to become OFF, the bidirectional selective oscillator 3 stops oscillating, and the phase state of the initial pulse signal is kept.

Thereafter, when the digital input signal representing −2 is inputted, the sign signal changes from high level to low level because −2 has a negative sign. The digital-to-pulse converter 1 outputs a pulse signal including a pulse with a pulse length corresponding to −2 (as long as two time the delay amount of each delay element 8*b*). While the pulse with this pulse length is outputted, all of the switches 9B are ON and supply power supply voltage to all of the delay elements 8*b*. The initial pulse signal kept by the third-stage delay element 8*a* (or the fourth-stage delay element 8*b*) is moved by the reverse ring oscillator 8B as much as two delay elements 8*b* in reverse direction to the node n1. When the output pulse drops at time t4, the GRON signal becomes low level to cause all of the switches 9B to become OFF, the bidirectional selective oscillator 3 stops oscillating, and the phase state of the initial pulse signal is kept.

Thereafter, when the digital input signal representing 9 is inputted, the sign signal changes from low level to high level because 9 has a positive sign. The digital-to-pulse converter 1 outputs a pulse signal including a pulse with a pulse length corresponding to 9 at time t5. While the pulse with this pulse length is outputted, all of the switches 9A are ON and supply power supply voltage to all of the delay elements 8*a*. The initial pulse signal kept by the first-stage (from the left) delay element 8*a* (or the seventh-stage delay element 8*b*) is moved by the forward ring oscillator 8A as much as nine delay elements 8*a* in forward direction, completing one round of loop and reaching at the node n3. When the output pulse drops at time t6, the GROP signal becomes low level to cause all of the switches 9A to become OFF, the bidirectional selective oscillator 3 stops oscillating, and the phase state of the initial pulse signal is kept.

As described above, the information processing device of FIG. 1 can perform integration processing on a plurality of digital input signals by using the single bidirectional selective oscillator 3.

The reader 4 determines whether an oscillation direction is forward or reverse, based on the sign signal inputted from the sign determination circuit 2 (the oscillation direction is unknown only from the signal in the bidirectional selective ring oscillator). The reader 4 determines that the initial pulse signal is moved in forward direction when the sign signal indicates "positive", and detects a change in phase state in forward direction. When the sign signal indicates "negative", the reader 4 determines that the initial pulse signal is moved in reverse direction, and detects a change in phase state in reverse direction. The reader 4 increases the number of oscillations by one count each time the initial pulse signal makes one round of forward loop in the bidirectional selective oscillator 3 (that is, the phase completes one cycle (changes 2π) in forward direction), and decreases the number of oscillations by one count each time the initial pulse signal makes one round of reverse loop (that is, the phase completes one cycle (changes 2π) in reverse direction). The reader 4 includes a counter 10 that counts the number of oscillations in this manner.

The reader 4 detects a phase state of the initial pulse signal based on signal levels (high level/low level) at the node n0 to n6 in the bidirectional selective ring oscillator 8. The reader 4 generates and outputs a digital output signal including the number of oscillations and the phase state. Alternatively, the reader 4 computes a result of integration from the number of oscillations and the phase state and outputs a digital output signal including the computed result of integration. In the above-described example of operation, since the number of oscillations is zero and the phase state is represented by 10, the result of integration is 10 (=3−2+9).

Here, a relation between a phase state of the initial pulse signal and a value corresponding to the phase state will be described.

In the example of the circuit shown in FIG. 4, the phase state has 14 stages from 0 to 13 (the number of the connected stages in the forward or reverse ring oscillator×2). Based on this, a value is assigned to each phase state as shown in FIG. 5 mentioned above, that is, as in the following. However, assignment of values to phase states is not limited to the following example.

0: When all of the nodes n0 to n6 have low level.
7: When all of the nodes n0 to n6 have high level.
1: When node n0 has high level and node n1 has low level.
2: When node n1 has high level and node n2 has low level.
3: When node n2 has high level and node n3 has low level.
4: When node n3 has high level and node n4 has low level.
5: When node n4 has high level and node n5 has low level.
6: When node n5 has high level and node n6 has low level.
8: When node n0 has low level and node n1 has high level.
9: When node n1 has low level and node n2 has high level.
10: When node n2 has low level and node n3 has high level.
11: When node n3 has low level and node n4 has high level.
12: When node n4 has low level and node n5 has high level.
13: When node n5 has low level and node n6 has high level.

As described above, the information processing device shown in FIG. 4 can endlessly perform integration processing of a plurality of digital input signals unless the counter 10 reaches an overflow level. Thus, integration processing of many digital input signals can be performed only with the information processing device of FIG. 4, and the scale of circuitry required for integration processing can be reduced.

The information processing device according to the present embodiment is intended to be configured with hardware. However, the information processing device may be implemented, for example, by a processor reading micro codes generated according to a predetermined algorithm.

Figure 7:
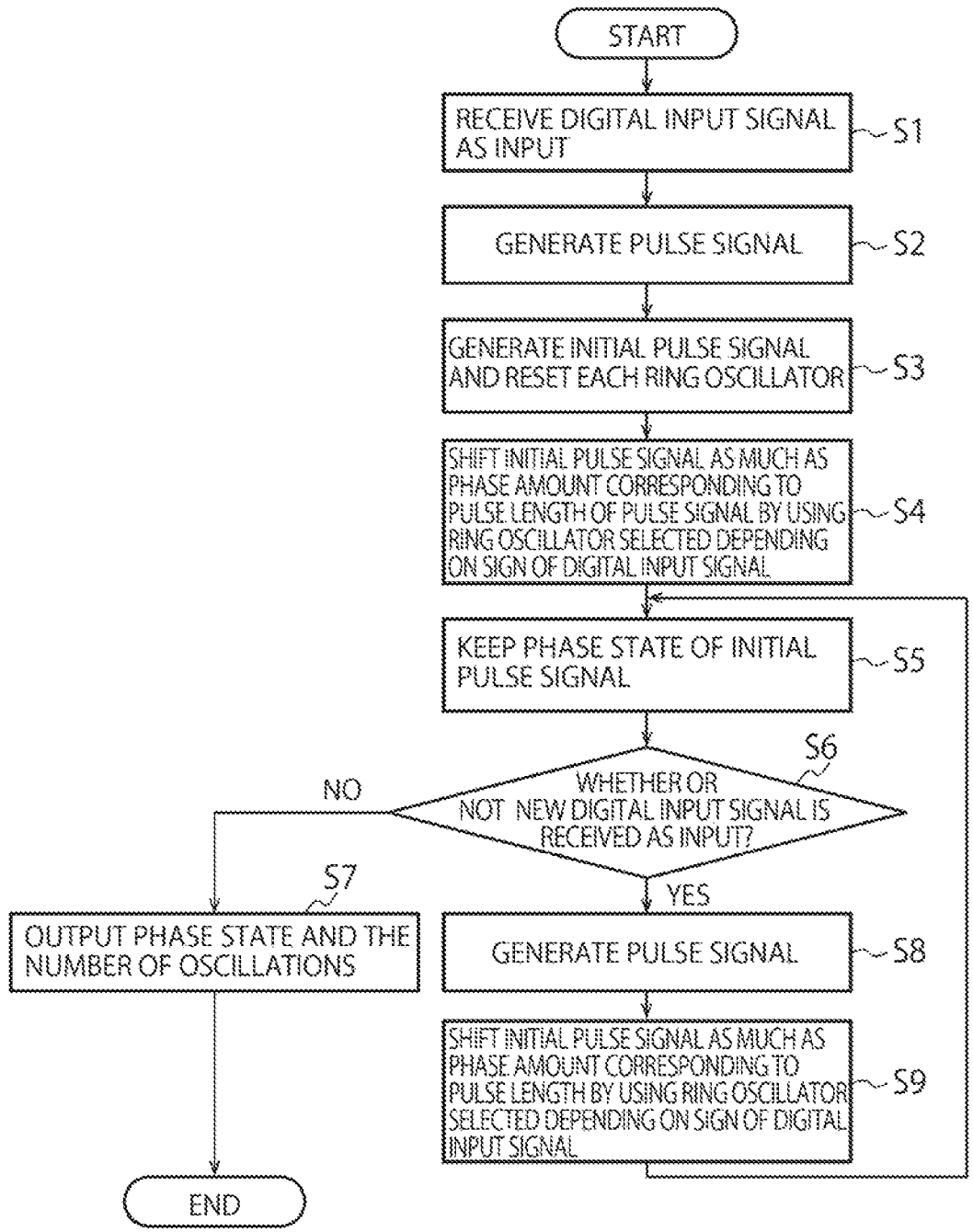
FIG. 7 is a flowchart showing a processing algorithm for the information processing device according to the first embodiment.

FIG. 7 is a flowchart showing a processing algorithm for the information processing device according to the present embodiment.

When a digital input signal is inputted to the digital-to-pulse converter 1 (step S1), the digital-to-pulse converter 1 generates a pulse signal including a pulse with a pulse length corresponding to the digital input signal (step S2). Before or after the processing in steps S1 and S2, the bidirectional selective oscillator 3 generates an initial pulse signal and also resets the forward ring oscillator 8A and the reverse ring oscillator 8B in the bidirectional selective oscillator 3 (step S3).

When the pulse signal generated in step S2 is inputted to the bidirectional selective oscillator 3, the plurality of switches corresponding to the ring oscillator (8A or 8B) selected depending on a sign of the digital input signal fall in and keep ON for a time period as long as the pulse length of the pulse signal, and the selected ring oscillator shifts the initial pulse signal as much as the pulse length of the pulse signal (step S4). At this time, if the initial pulse signal makes one round of loop in the bidirectional selective oscillator 3, the counter 10 increases the count value.

When the time period as long as the pulse length of the pulse signal generated in step S2 has passed, the plurality of switches (9A or 9B) fall in OFF, and the phase state of the initial pulse signal (respective signal levels at the nodes) is kept (step S5).

Next, it is determined whether or not a new digital input signal is inputted to the digital-to-pulse converter 1 (step S6). If a new digital input signal is not inputted (NO in step S6), the reader 4 outputs a digital output signal including the phase state of the initial pulse signal and the number of oscillations of the bidirectional selective oscillator 3, which is represented by the count value of the counter 10, and ends processing (step S7). The reader 4 may output a digital output signal including an integrated value identified from the phase state and the number of oscillations (same step S7).

If a new digital input signal is inputted to the digital-to-pulse converter 1 in step S6 (YES in step S6), the digital-to-pulse converter 1 generates a pulse signal including a pulse with a pulse length corresponding to the new digital input signal as in step S2 (Step S8). When the pulse signal generated in step S8 is inputted to the bidirectional selective oscillator 3, the plurality of switches (9A or 9B) corresponding to the ring oscillator (8A or 8B) selected depending on a sign of the digital input signal fall in ON, and the selected ring oscillator shifts the kept initial pulse signal as much as the pulse length of the new pulse signal (step S9). When a time period as long as the pulse length of the pulse signal generated in step S8 has passed, processing in and after step S5 is performed.

As described above, in the first embodiment, the digital-to-pulse converter 1 generates a pulse signal including a pulse with a pulse length corresponding to a digital input signal, and the bidirectional selective oscillator 3, to which the pulse signal is inputted, performs oscillation operation by using one of the ring oscillators selected depending on a sign of the digital input signal while the pulse signal is outputting the pulse, and keeps a state of the oscillation operation when the output of the pulse stops. Accordingly, integration of a plurality of digital input signals, including positive and negative ones, can be performed with a simple circuit configuration. In the first embodiment, in particular, integration can be performed using the single bidirectional selective oscillator 3, by sequentially inputting a plurality of digital input signals to the digital-to-pulse converter 1, and therefore the configuration of the information processing device is not complicated even if the number of digital input signals to be computed increases. Accordingly, integration of many digital input signals can be performed with the information processing device with the simple circuit configuration.

Second Embodiment

A second embodiment is configured to be able to perform a multiply-accumulate operation.

Figure 8:
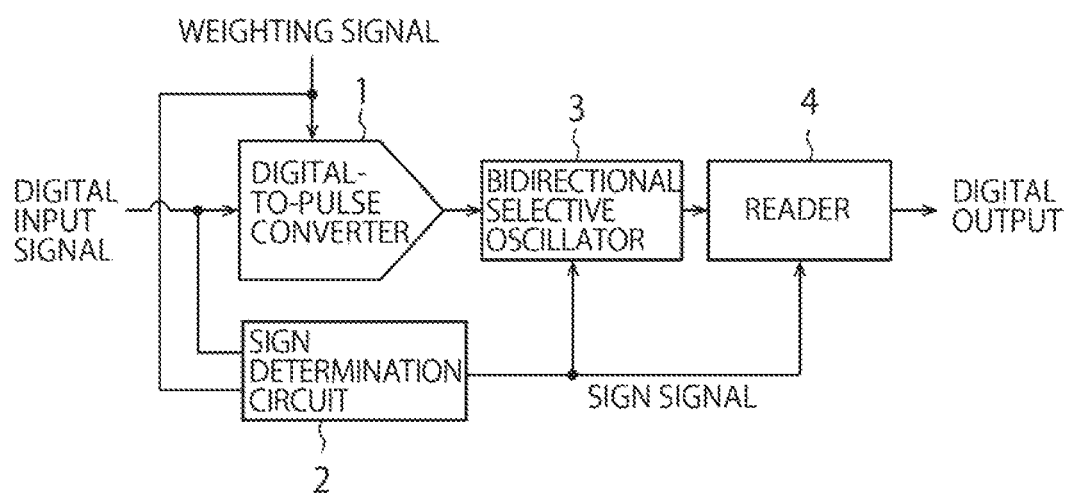
FIG. 8 is a block diagram showing a schematic configuration of an information processing device according to a second embodiment.

FIG. 8 is a block diagram showing a schematic configuration of an information processing device according to the second embodiment. The information processing device of FIG. 8 is different from the information processing device of FIG. 1 in processing operation of the digital-to-pulse converter 1 and the sign determination circuit 2. A weighting signal for a digital input signal is inputted to a digital-to-pulse converter 1 and a sign determination circuit 2 shown in FIG. 8. If an input signal matrix and a weighting signal are represented by "DIN[1:N]" and "W[1:N]", respectively, a digital output signal "Out", which is an output of the information processing device of FIG. 8, is expressed by the following expression (2).

[Expression 2]

$$\text{Out} = \sum_{i=1}^{N} DIN[i] \times W[i] \quad (2)$$

For a method for computing the expression (2), the digital-to-pulse converter 1 weights each digital input signal, according to the information processing device of FIG. 8.

The sign determination circuit 2 determines a sign of a product of the digital input signal and the weighting signal and outputs a sign signal to a bidirectional selective oscillator 3 and a reader 4.

The digital-to-pulse converter 1 shown in FIG. 8 can be depicted as a block configuration similar to that of FIG. 2. However, an internal configuration of a variable delayer 5 has a characteristic feature.

Figure 9:
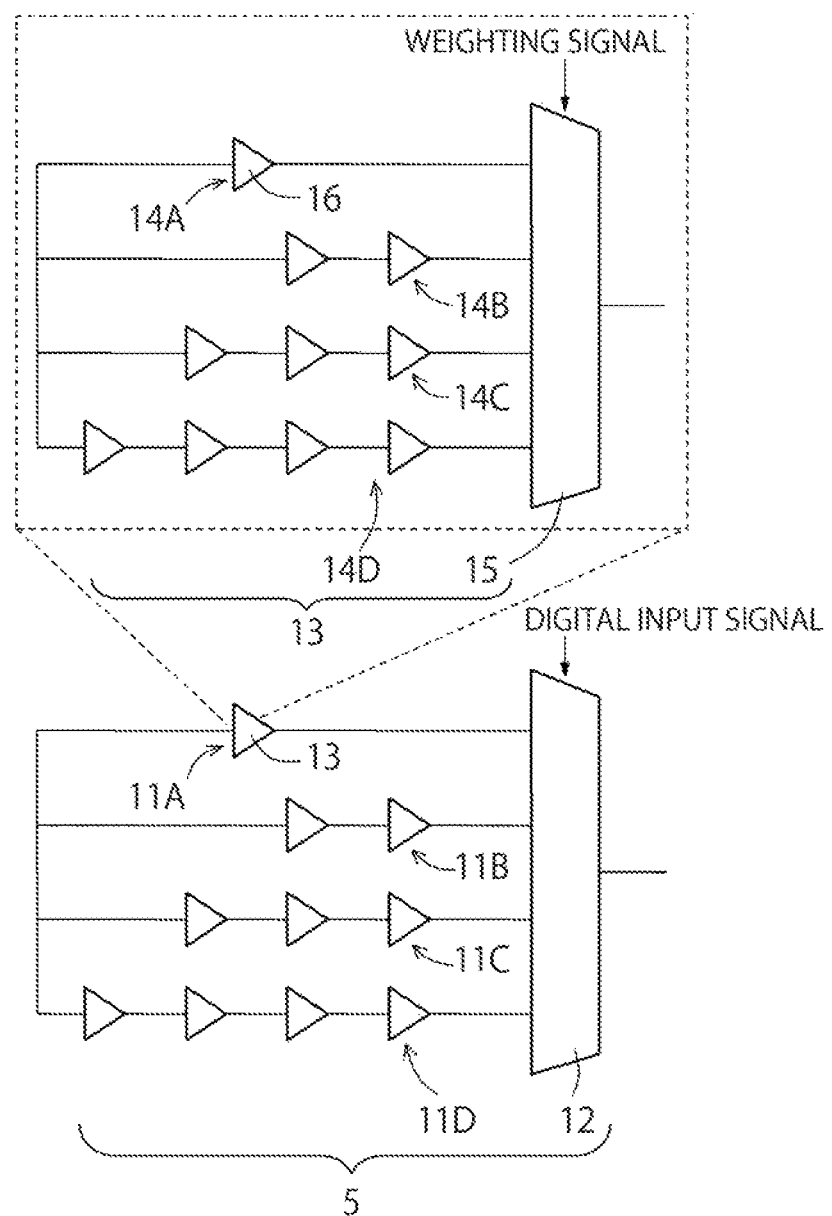
FIG. 9 is a block diagram showing an example of an internal configuration of a variable delayer according to the second embodiment.

FIG. 9 is a block diagram showing an example of the internal configuration of the variable delayer 5 according to the second embodiment. Referring to a lower part of FIG. 9, the variable delayer 5 includes four first delay circuits 11A, 118, 11C, and 11D and a first multiplexer 12 with four inputs. The four first delay circuits 11A, 11B, 11C, and 11D have different numbers of connected stages of variable delay elements 13, and differ from each other in delay amount depending on the respective numbers of the connected stages of the variable delay elements 13. The first multiplexer 12 selects one of output signals of the four first delay circuits 11A, 118, 11C, and 11D based on the digital input signal.

Each variable delay element 13 has four second delay circuits 14A, 148, 14C, and 14D and a second multiplexer 15 with four inputs, as shown in an upper part of FIG. 9. The four second delay circuits 14A, 14B, 14C, and 14D have different numbers of connected stages of delay elements 16, and the second multiplexer 15 selects one of output signals of the four second delay circuits 14A, 14B, 14C, and 14D based on the weighting signal corresponding to the digital input signal.

The variable delayer 5 of FIG. 9 shows an example in which both the digital input signal and the weighting signal are represented by two bits. Since there are four types of digital input signals when a digital input signal is represented by two bits, a delay amount corresponding to one of the four types is selected by the first multiplexer 12 shown in the lower part of FIG. 9. Since there are four types of weighting signals when a weighting signal is represented by two bits, a delay amount corresponding to one of the four types is selected by the second multiplexer 15 shown in the upper part of FIG. 9. Thus, the variable delayer 5 not only changes the delay amount depending on the digital input signal but also changes the delay amount depending on the weighting signal.

Note that the number of bits representing the digital input signal and the weighting signal is not limited to two. The circuit configuration of the variable delayer 5 of FIG. 9 may be changed according to the number of bits representing the digital input signal and the weighting signal.

A pulse signal converted by the digital-to-pulse converter 1 of FIG. 9 is inputted to the bidirectional selective oscillator 3 of FIG. 8. As in the first embodiment, the bidirectional selective oscillator 3 performs oscillation operation for a time period as long as a pulse length of the pulse signal by using one of the ring oscillators selected depending on a sign of the digital input signal, and keeps a state of the oscillation operation when the time period the pulse is outputted has passed. Thus, the bidirectional selective oscillator 3 can perform integration of an arithmetic result of summation performed by the digital-to-pulse converter 1.

As described above, according to the second embodiment, a multiply-accumulate operation can be performed because the digital-to-pulse converter 1 weights a digital input signal with a weighting signal corresponding to the digital input signal. Moreover, since the weighting of a digital input signal can be performed by using a plurality of delay circuits and a multiplexer, provision of a multiplication circuit with a complicated configuration is not required.

Figure 10:
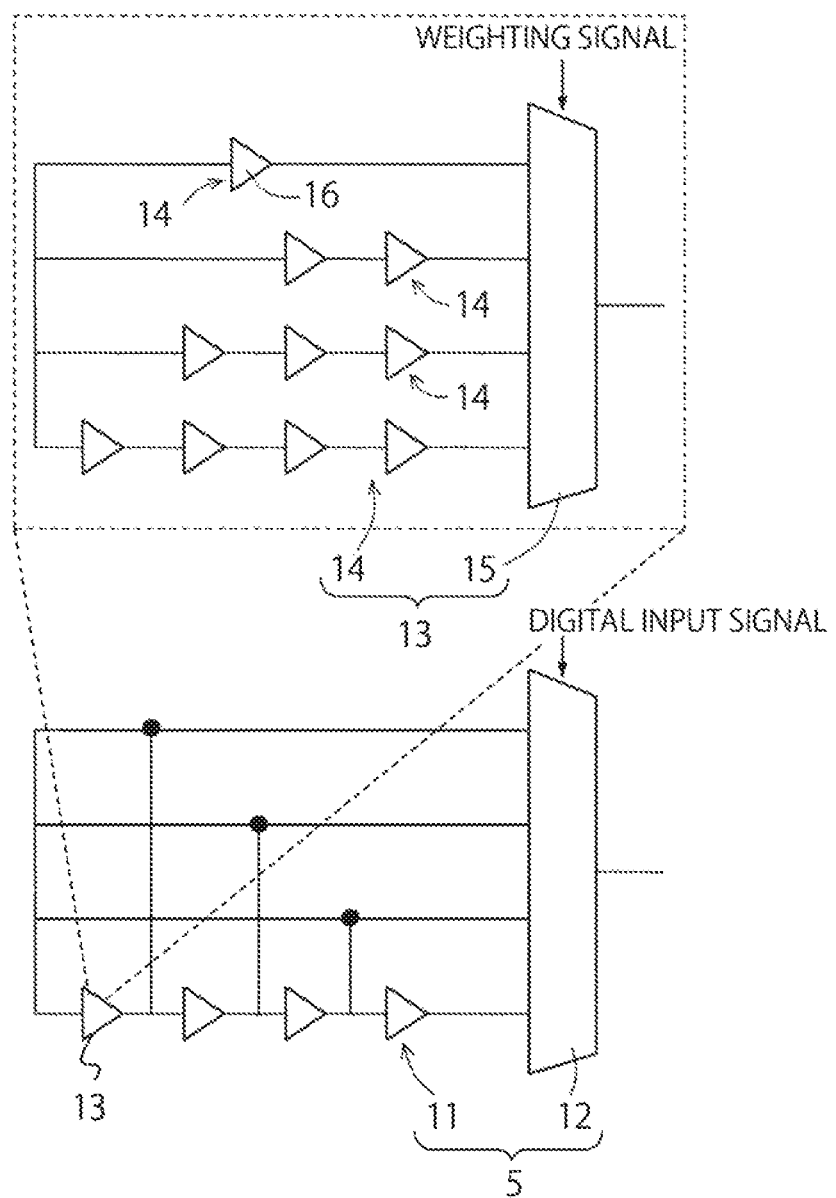
FIG. 10 is a block diagram showing a modified example of the configuration of FIG. 9.

FIG. 10 shows a modified example of the variable delayer 5 of FIG. 9. Referring to a lower part of FIG. 10, a first delay circuit 11 including four variable delay elements 13 connected in series is connected to a fourth input (the lowest input on the page) of a first multiplexer 12, while in the example shown in FIG. 9, the first delay circuits including different numbers of connected stages of the variable delay elements 13 are deployed at the inputs of the first multiplexer 12, respectively. An output of the first-stage variable delay element of the first delay circuit 11 is connected to a first input of the first multiplexer 12, an output of the second-stage variable delay element of the first delay circuit 11 is connected to a second input of the first multiplexer 12, and an output of the third-stage variable delay element of the first delay circuit 11 is connected to a third input of the first multiplexer 12. Thus, operation similar to the operation shown in FIG. 9 can be implemented with a smaller number of variable delay elements, and accordingly, the area of circuitry can be reduced. Note that the first delay circuit 11 may be connected to any one of the other inputs of the first multiplexer 12, not to the fourth input.

A configuration of each variable delay element 13 is similar to the configuration shown in FIG. 9, but may be modified similarly to the variable delayer 5. That is, a second delay circuit 14 including four delay elements 16 connected in series may be connected to, for example, a fourth input of a second multiplexer 15, and respective outputs of the first- to third-stage delay elements of the second delay circuit 14 are connected to first to third inputs of the second multiplexer 15, respectively. Thus, the area of circuitry can be reduced.

Third Embodiment

In the second embodiment, the digital-to-pulse converter 1 performs summation of a digital input signal and a weighting signal. Accordingly, the larger the weighting signal, the longer pulse length a pulse signal to be inputted to the bidirectional selective oscillator 3 has, resulting in the number of oscillations of the bidirectional selective oscillator 3 increasing, and arithmetic processing taking longer time. A third embodiment, which will be described below, is configured to solve this problem.

Figure 11:
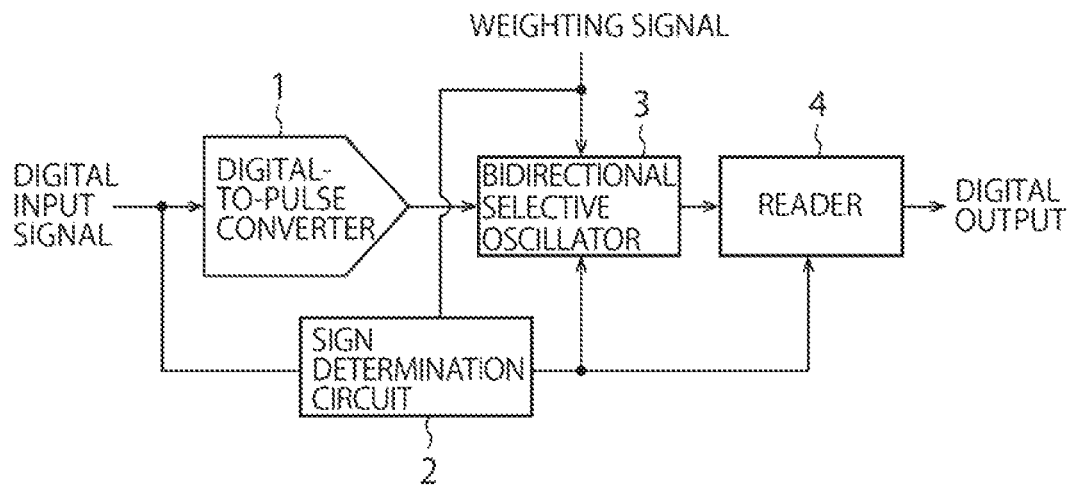
FIG. 11 is a block diagram showing a schematic configuration of an information processing device according to a third embodiment.

FIG. 11 is a block diagram showing a schematic configuration of an information processing device according to the third embodiment. The information processing device of FIG. 11 is different from the information processing devices of FIGS. 1 and 8 in configuration of bidirectional selection oscillator 3. A configuration of a sign determination circuit 2 is similar to the configuration shown in FIG. 8. In addition to a pulse signal outputted from a digital-to-pulse converter 1, a weighting signal is inputted to a bidirectional selective oscillator 3 and the sign determination circuit 2 shown in FIG. 11. The bidirectional selective oscillator 3 of FIG. 11 controls oscillation frequency by using the weighting signal, thereby performing a multiply-accumulate operation.

Figure 12:
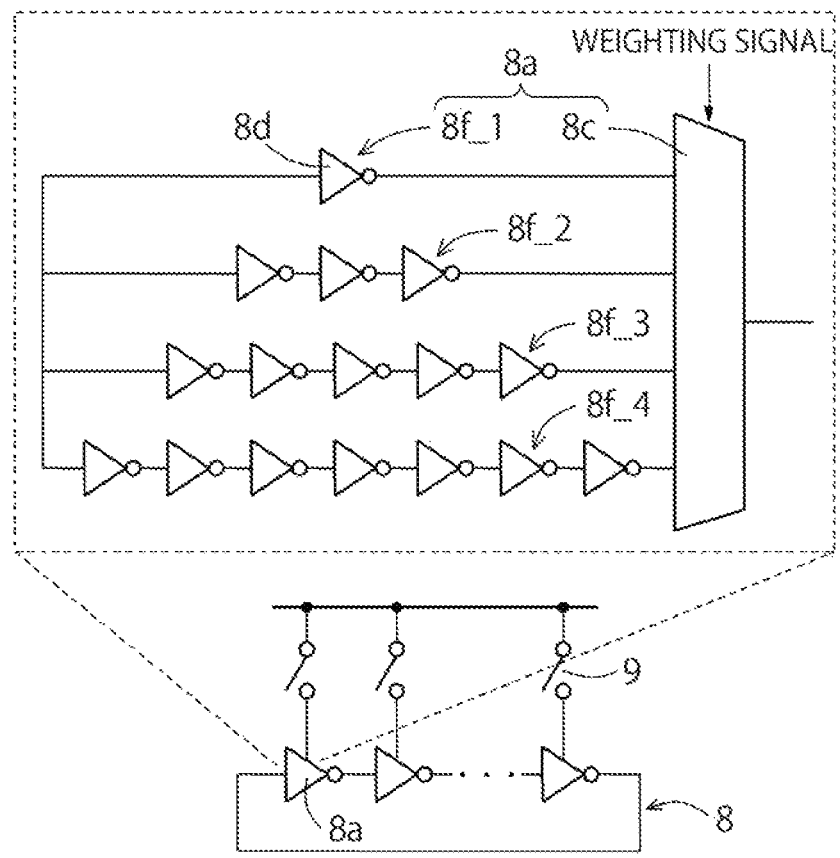
FIG. 12 is a block diagram showing an example of an internal configuration of each of delay elements included in each of ring oscillators of FIG. 11.

FIG. 12 is a block diagram showing an example of an internal configuration of each of delay elements 8a included in a forward ring oscillator 8A in the bidirectional selective oscillator 3 of FIG. 11. A configuration of each of delay elements 8b included in a reverse ring oscillator 8B is similar to that of each delay element 8a, and therefore a description and depiction thereof will be omitted.

The delay element 8a shown in FIG. 12 includes four third delay circuits 8f_1, 8f_2, 8f_3, and 8f_4 and a third multiplexer Sc with four inputs. The four third delay circuits 8f_1, 8f_2, 8f_3, and 8f_4 have different numbers of connected stages of unit delay elements 8d, and differ from each other in delay amount depending on the respective numbers of the connected stages of the unit delay elements 8d, The third multiplexer 8c selects one of output signals of the four third delay circuits 8f_1, 8f_2, 8f_3, and 8f_4 based on a weighting signal for a digital input signal.

The forward ring oscillator 8A is configured by connecting a plurality of delay elements 8a in a ring shape as shown in FIG. 4, and each delay element 8a includes one or more unit delay elements 8d as shown in FIG. 12, Each unit delay element 8d is, for example, an inverter. Ignoring a delay amount of the third multiplexer 8c, and assuming that "tinv" is a delay amount of each unit delay element 8d and "Z" is the number of the unit delay elements 8d selectively included in all of the delay elements 8a included in the forward ring oscillator 8A, an oscillation frequency of the forward ring oscillator 8A is expressed by the following expression (3).

[Expression 3]

$$freq = \frac{1}{Z \times t_{inv}} \quad (3)$$

As can be seen from the expression (3), the oscillation frequency changes with the number "Z" of all unit delay elements 8d in the forward ring oscillator SA and the delay amount "tinv" of each unit delay element 8d. For example, when a digital input signal "DIN" is 9, the number of oscillations is three if Z=3, and the number of oscillations is 9/5=1.8 if Z=5. In this manner, summation according to the number of connected stages of the unit delay elements 8d is performed. For example, the value of "Z" is made smaller as the weighting signal is larger, whereby the oscillation frequency of the forward ring oscillator 8A is increased, and a multiply-accumulate operation can be performed at higher speed.

As described above, in the third embodiment, the oscillation frequencies of the forward ring oscillator and the reverse ring oscillator is variably controlled depending on the weighting signal. Accordingly, even if the weighting signal is larger, the bidirectional selective oscillator 3 does not require longer time to perform a multiply-accumulate operation. Methods for changing the oscillation frequencies of the ring oscillators include not only the above-described method of changing the number of connected stages, but a general digitally controlled oscillator (DCO) method can also be used. For example, to change oscillation frequency, the delay amount "tinv" in the expression (3) is changed by adding a variable capacity load controlled by a digital signal to an output of each inverter, whereby the oscillation frequency can be controlled. Moreover, using current drive inverters, the delay amount "tinv" is changed by controlling driving current, whereby the oscillation frequency "freq" can also be controlled.

Figure 13:
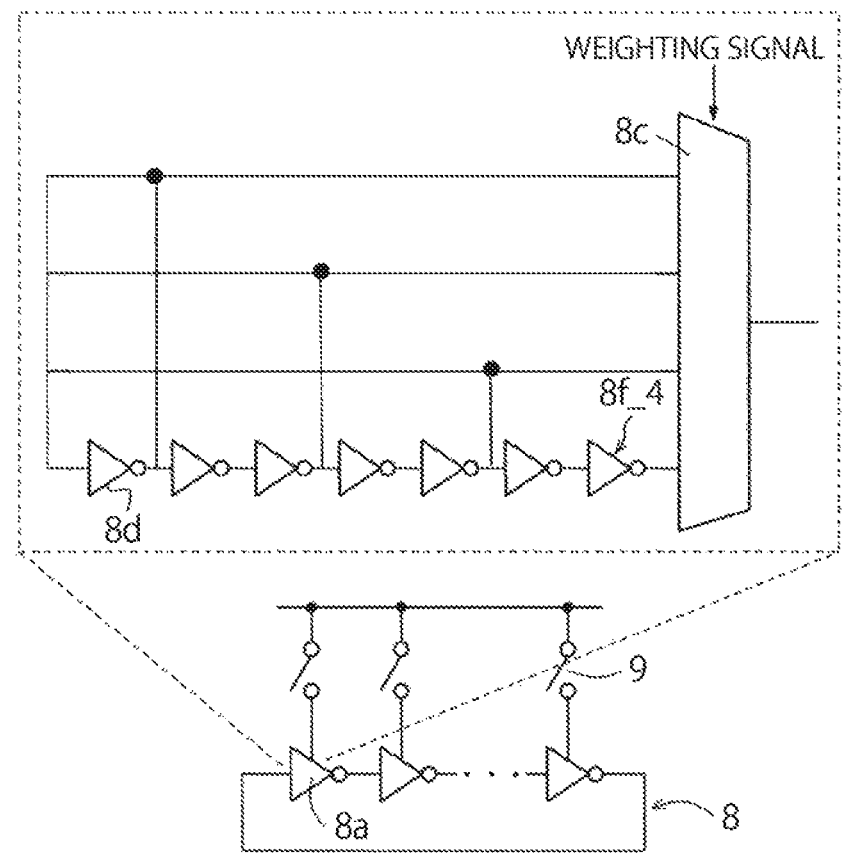
FIG. 13 is a block diagram showing a modified example of the configuration of FIG. 12.

FIG. 13 shows a modified example of an internal configuration of the delay element 8a shown in FIG. 12. Similar modification can be made to an internal configuration of each delay element 8b. In the modified example, the third delay circuit 8f_4 including seven connected stages of the unit delay elements 8d is connected to a fourth input (the lowest input on the page) of the third multiplexer 8c, while in the example shown in FIG. 12, the third delay circuits including different numbers of connected stages of the unit delay elements 8d are connected to the inputs of the third multiplexer 8c, respectively. An output of the first-stage unit delay element 8d of the third delay circuit 8f_4 is connected to a first input of the third multiplexer Sc, an output of the third-stage unit delay element 8d of the third delay circuit 8f_4 is connected to a second input of the third multiplexer 8c, and an output of the fifth-stage unit delay element 8d of the third delay circuit 8f_4 is connected to a third input of the third multiplexer 8c. Thus, operation similar to the operation shown in FIG. 12 can be implemented with a smaller number of unit delay elements, and accordingly, the area of circuitry can be reduced. Note that the third delay circuit 8f_4 may be connected to any one of the other inputs of the third multiplexer 8c, not to the fourth input.

Figure 14:
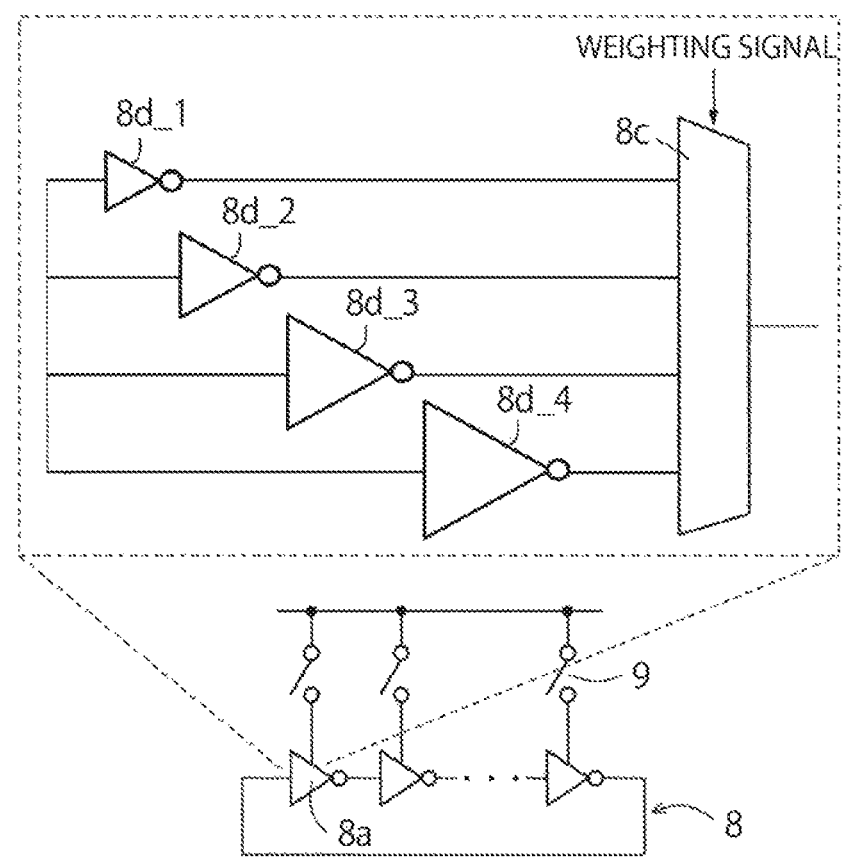
FIG. 14 is a block diagram showing another modified example of the configuration of FIG. 12.

FIG. 14 shows another modified example of the internal configuration of the delay element 8a shown in FIG. 12. Similar modification can be made to the internal configuration of each delay element 8b. In the other modified example, delay elements with different delay amounts are connected to the inputs of the third multiplexer 8c, respectively, while in the example shown in FIG. 12, the third delay circuits including different numbers of connected stages of the unit delay elements 8d are connected to the inputs of the third multiplexer 8c, respectively. A delay element 8d_1 with a smallest delay amount, a delay element 8d_2 with a second smallest delay amount, a delay element 8d_3 with a third smallest delay amount, and a delay element 8d_4 with a largest delay amount are connected to the first to fourth inputs, respectively. The third multiplexer 8c selects one of output signals of the four delay elements 8d_1 to 8d_4 based on a weighting signal for a digital input signal. For example, the multiplexer 8c selects a delay element with a smaller delay amount for a larger weighting signal. Thus, the oscillation frequency is increased, and a multiply-accumulate operation can be performed at higher speed.

Fourth Embodiment

A fourth embodiment, which will be described below, is configured to perform an add operation on an output signal or output signals from one or more readers.

Figure 15:
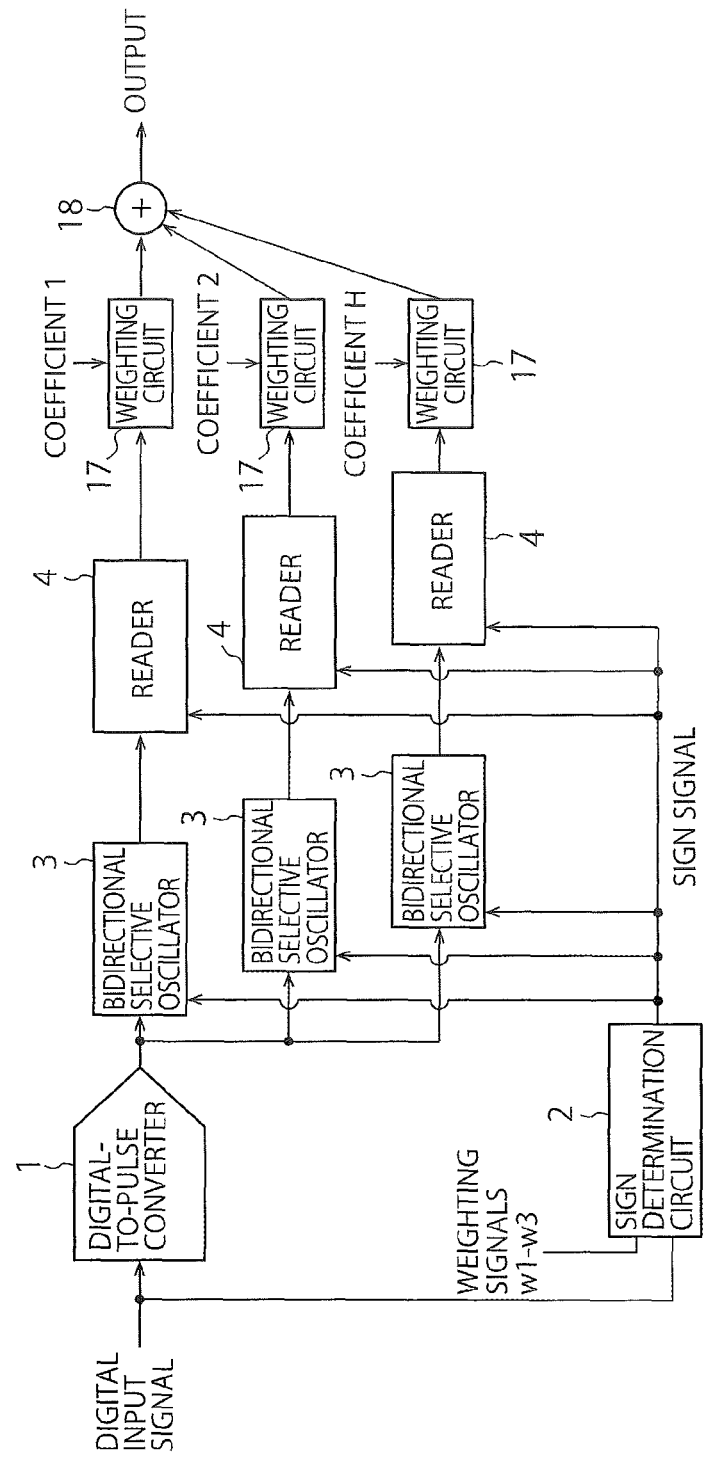
FIG. 15 is a block diagram showing a schematic configuration of an information processing device according to a fourth embodiment.

FIG. 15 is a block diagram showing a schematic configuration of an information processing device according to the fourth embodiment. The information processing device of FIG. 15 includes a plurality of pairs of a bidirectional selective oscillator 3 and a reader 4. The pairs of the bidirectional selective oscillators 3 and the readers 4 correspond to different weighting signals for digital input signals, respectively. FIG. 15 shows an example in which three pairs of the bidirectional selective oscillators 3 and the readers 4 are provided in association with three types of weighting signals w1 to w3. Note that the number of types of weighting signals is not limited three. For example, if there are n types of weighting signals, n pairs of the bidirectional selective oscillators 3 and the readers 4 may be provided.

A weighting signal is inputted to a sign determination circuit 2. The sign determination circuit 2 selects one or more pairs corresponding to the weighting signal. For example, when the weighting signal indicates 1, the sign determination circuit 2 selects a first pair. When the weighting signal indicates 2, the sign determination circuit 2 selects a second pair. When the weighting signal indicates 3, the sign determination circuit 2 selects a third pair. If the weighting signal is represented by S bits, as many patterns as 2 to the S-th power exist for the weighting signal, and a pair or pairs corresponding to each pattern are provided. The bidirectional selective oscillator 3 in a selected pair performs oscillation operation for a time period as long as a pulse length of an inputted pulse signal. The reader 4 in the selected pair outputs a digital output signal including a state of the oscillation operation of the corresponding bidirectional selective oscillator 3.

A multiplier (weighing circuit) 17 is connected to the reader 4 in each pair. A coefficient corresponding to a weighting signal is given to the multiplier 17 for each pair. For example, 1 is given to the multiplier 17 for the first pair, 2 is given to the multiplier 17 for the second pair, and 3 is given to the multiplier 17 for the third pair. The multiplier 17 for each pair performs processing of multiplying the digital output signal from the corresponding reader 4 by the corresponding coefficient. Respective results of the multiplication performed by the multipliers 17 are combined by an adder (combiner) 18 and a final result of a multiply-accumulate operation can be obtained.

As described above, in the fourth embodiment, multiply-accumulate processing is performed at a stage subsequent to the readers 4. Accordingly, time required for the bidirectional selective oscillator 3 to perform arithmetic processing unlikely changes depending on the weighting signal. Moreover, the internal configuration of the bidirectional selective oscillator 3 can be more simplified than that of the third embodiment.

Fifth Embodiment

A fifth embodiment is configured to weight a digital input signal to be inputted to a digital-to-pulse converter 1.

Figure 16:
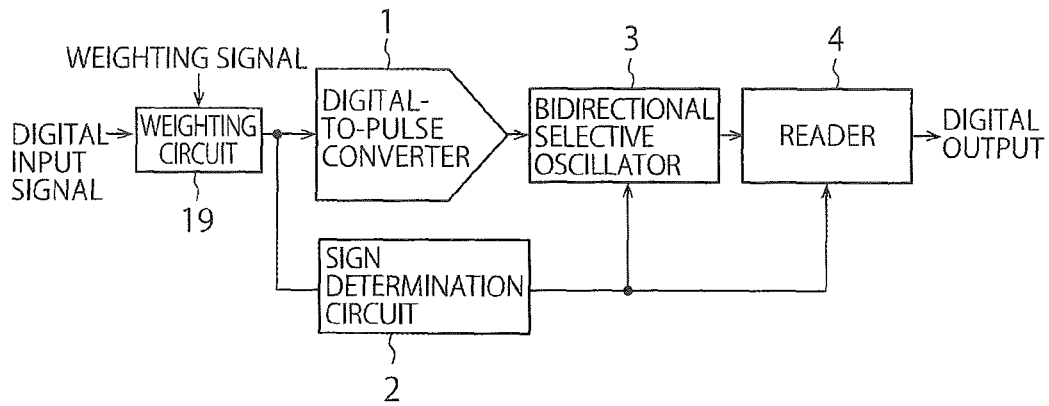
FIG. 16 is a block diagram showing a schematic configuration of an information processing device according to a fifth embodiment.

FIG. 16 is a block diagram showing a schematic configuration of an information processing device according to the fifth embodiment. The information processing device of FIG. 16 includes a multiplier (weighing circuit) 19 in addition to the configuration shown in FIG. 1. The multiplier 19 performs processing of multiplying a digital input signal by a weighting signal. The digital input signal weighted by the multiplier 19 is inputted to the digital-to-pulse converter 1. Although processing operation of the digital-to-pulse converter 1, a bidirectional selective oscillator 3, and a reader 4 is similar to that of the information processing device of FIG. 1, the information processing device of FIG. 16 can perform a multiply-accumulate operation because a digital input signal to be inputted to the digital-to-pulse converter 1 is already weighted.

As described above, since processing of weighting a digital input signal is performed at a stage prior to the digital-to-pulse converter 1, a multiply-accumulate operation can be performed even if the digital-to-pulse converter 1 and the subsequent portions are configured similarly to those shown in FIG. 1.

Of the above-described scenarios of weighting processing shown in FIGS. 8 to 16, at least two or more scenarios of weighting processing may be performed in combination. For example, the weighting processing performed in the digital-to-pulse converter 1 shown in FIG. 8 and the weighting processing performed in the bidirectional selective oscillator 3 shown in FIG. 11 may be performed. Thus, more complicated multiply-accumulate processing can be performed.

Sixth Embodiment

A digital input signal and a weighting signal are binary values, but may be represented as values that vary in a unit of a power of 2, For example, digital input signals may be (000=0), (001=1), (010=2), (011=3), (100=8), and the like. Using a logarithm "log 2" for representation, values represented by a power of 2 are values that increase one by one and therefore can be easily handled. Accordingly, a design and the like of a variable delayer 5 can be simplified.

Alternatively, a digital input signal and a weighting signal may be values that vary in a unit of a same value. Thus, an interval between values of each signal can be made constant, and arithmetic operations with higher precision can be accomplished.

Seventh Embodiment

A plurality of the information processing devices described in any of the above first to sixth embodiments are deployed and operated in parallel, whereby a multiply-accumulate core with high arithmetic performance and parallel multiply-accumulate functionality can be constructed.

Figure 17:
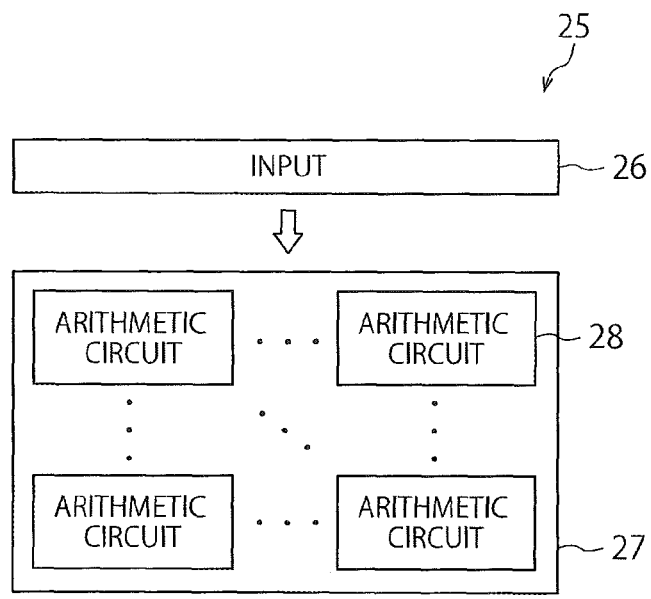
FIG. 17 is a block diagram showing an example of an internal configuration of a multiply-accumulate core with parallel operation capability including a plurality of the information processing devices described in any of the first to sixth embodiments.

FIG. 17 is a block diagram showing an example of an internal configuration of a multiply-accumulate core with parallel operation capability including a plurality of the information processing devices described in any of the first to sixth embodiments. For example, the multiply-accumulate core 25 of FIG. 17 can be mounted on a semiconductor substrate or a printed board, and includes an input 26 and a processor 27. In the processor 27, a plurality of arithmetic circuits 28 each having the same function as any one of the information processing devices described in the first to sixth embodiments are deployed. Each arithmetic circuit 28 can perform arithmetic processing in a parallel or sequential manner depending on necessity.

Figure 18:
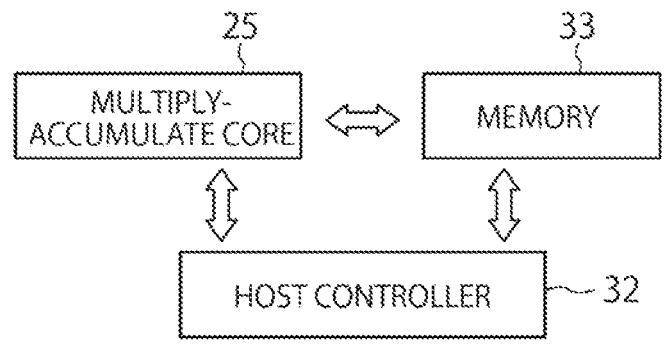
FIG. 18 is a block diagram showing an example of a schematic configuration of a signal processing device including the multiply-accumulate core shown in FIG. 17.

FIG. 18 is a block diagram showing an example of a schematic configuration of a signal processing device including the multiply-accumulate core shown in FIG. 17, The signal processing device of FIG. 18 includes the multiply-accumulate core 25 shown in FIG. 17, a host controller 32, and a memory 33. The memory 33 includes at least one of a nonvolatile memory and a volatile memory. Moreover, the memory 33 may be divided into layers such as cash memory and main memory. The signal processing device of FIG. 18 may be formed on a semiconductor substrate as a chip, or may be implemented on a printed board.

Figure 19:
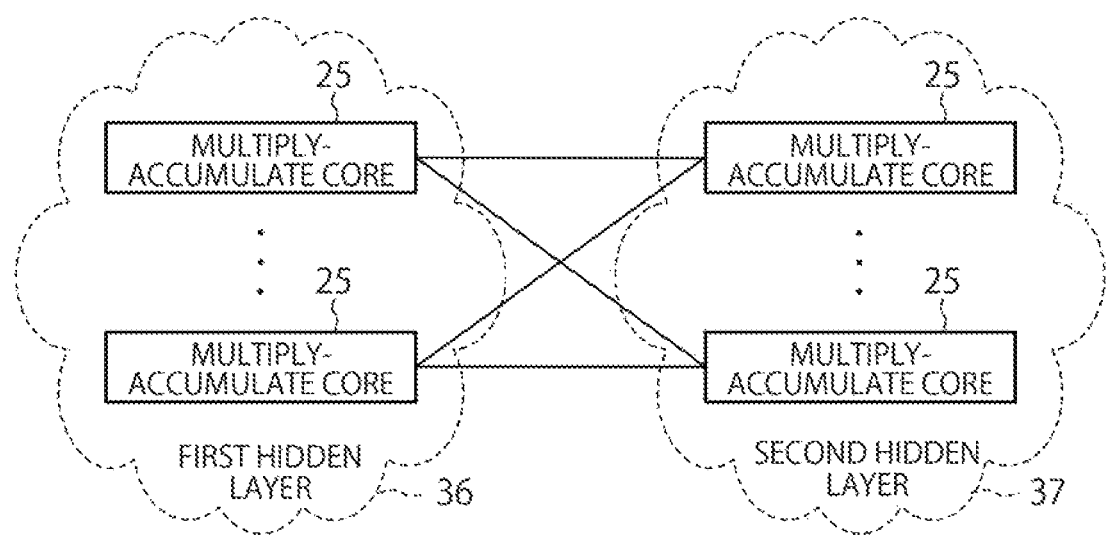
FIG. 19 is a block diagram showing an example of a brain-like neural network system.

A brain-like neural network system may be built by using the multiply-accumulate core 25 shown in FIGS. 17 and 18. FIG. 19 is a block diagram showing an example of the brain-like neural network system. The neural network system of FIG. 19 has a layered structure, wherein a plurality of the multiply-accumulate cores 25 in a first hidden layer 36 and a plurality of the multiply-accumulate cores 25 in a second hidden layer 37 perform various multiply-accumulate operations. Moreover, output signals of the plurality of multiply-accumulate cores 25 in the first hidden layer 36 are weighted and then inputted to the plurality of multiply-accumulate cores 25 in the second hidden layer 37.

As described above, according to the seventh embodiment, a plurality of the information processing devices described in any of the first to sixth embodiments are deployed, whereby multiply-accumulate operations for various uses can be performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An information processing device, comprising:
a digital-to-pulse converter configured to output a pulse signal including a pulse with a pulse length corresponding to a digital input signal; and
a bidirectional selective oscillator including a first ring oscillator and a second ring oscillator, the first ring oscillator including a plurality of delay elements connected in a ring shape in a first direction, the second ring oscillator including a plurality of delay elements connected in a ring shape in a second direction reverse to the first direction,
wherein the bidirectional selective oscillator is configured to select one of the first ring oscillator and the second ring oscillator depending on a sign of the digital input signal.

2. The information processing device according to claim 1, wherein the digital-to-pulse converter is configured to output sequentially N pulse signals corresponding to N digital input signals, where "N" is an integer not smaller than 2, and
each time one pulse of each of the N pulse signals is sequentially input to the bidirectional selective oscillator, the bidirectional selective oscillator is configured to cause one of the ring oscillators sequentially selected depending on a sign of each of the N digital input signals to resume oscillation from the kept state of oscillation operation.

3. The information processing device according to claim 2, wherein the bidirectional selective oscillator is configured to sequentially shift an initial pulse signal through the plurality of delay elements in the selected ring oscillator,
the bidirectional selective oscillator is configured to keep a number of oscillations and a phase state of the initial pulse signal when the pulse stops being outputted, and
each time one of the N pulse signals is sequentially input to the bidirectional selective oscillator, the bidirectional selective oscillator is configured to sequentially shift the initial pulse signal from the kept phase state.

4. The information processing device according to claim 3, further comprising a reader configured to output a digital output signal indicating the state of oscillation operation when the pulse included in an N-th one of the N pulse signals stops being outputted.

5. The information processing device according to claim 4, wherein the bidirectional selective oscillator and the reader make one pair, a plurality of the pairs are provided, and the pairs differ with weighting signals for the digital input signal,
the information processing device further comprising:
a plurality of weighing circuits configured to weight a plurality of the digital output signals outputted from a plurality of the readers in the plurality of pairs, depending on the weighting signals corresponding to the plurality of weighing circuits; and
a combiner configured to combine output signals of the plurality of weighing circuits,
wherein the digital-to-pulse converter inputs the digital input signals to the bidirectional selective oscillators in the pairs corresponding to the weighting signals.

6. The information processing device according to claim 1, further comprising a sign determination circuit configured to determine a sign of the digital input signal,
wherein the bidirectional selective oscillator is configured to select the one ring oscillator based on the sign determined by the sign determination circuit.

7. The information processing device according to claim 1, wherein a number of connected stages of the delay elements in each of the first ring oscillator and the second ring oscillator is "X", and
an input of one of the delay elements in a Y-th stage in the first ring oscillator is connected to an output of one of the delay elements in an (X−Y+1)th stage in the second ring oscillator, where "Y" is an integer not smaller than 1 and not larger than X.

8. The information processing device according to claim 1, wherein the pulse length of the pulse included in the pulse signal output by the digital-to-pulse converter depends on the digital input signal and on a weighting signal for the digital input signal.

9. The information processing device according to claim 1, further comprising a weighing circuit configured to weight the digital input signal with a weighting signal for the digital input signal to generate a weighted digital input signal, and input the weighted digital input signal to the digital-to-pulse converter.

10. The information processing device according to claim 1, wherein each of the plurality of delay elements in the first ring oscillator and the second ring oscillator has a delay time depending on a weighting signal for the digital input signal.

11. The information processing device according to claim 1, wherein the bidirectional selective oscillator is configured to oscillate the selected ring oscillator during a period when the pulse is outputted.

12. The information processing device according to claim 11, wherein the bidirectional selective oscillator is configured to keep a state of oscillation operation when the pulse stops being outputted.

13. A semiconductor device, comprising a multiply-accumulate core in which a plurality of arithmetic circuits are deployed on a single semiconductor substrate, wherein each of the arithmetic circuits includes the information processing device according to claim 1.

14. An information processing method, comprising:
   outputting a pulse signal including a pulse with a pulse length corresponding to a digital input signal; and
   performing oscillation operation during a period when the pulse signal outputs the pulse wherein the oscillation operation causes a shift of a phase in a first direction in case of a sign of the digital input signal being positive and causes the shift of the phase in a second direction reverse to the first direction in case of the sign of the digital input signal being negative.

15. The information processing method according to claim 14, further comprising:
   keeping a state of oscillation operation when the pulse stops being outputted.

* * * * *